United States Patent
Tabata et al.

(10) Patent No.: US 8,952,756 B2
(45) Date of Patent: Feb. 10, 2015

(54) ANTENNA DRIVE APPARATUS

(71) Applicant: Aisin Seiki Kabushiki Kaisha, Kariya-shi, Aichi-ken (JP)

(72) Inventors: Takehiro Tabata, Kariya (JP); Masahiro Hagimoto, Nagoya (JP)

(73) Assignee: Aisin Seiki Kabushiki Kaisha, Aichi-ken (JP)

( * ) Notice: Subject to any disclaimer, the term of this patent is extended or adjusted under 35 U.S.C. 154(b) by 30 days.

(21) Appl. No.: 13/944,590

(22) Filed: Jul. 17, 2013

(65) Prior Publication Data
US 2014/0022013 A1   Jan. 23, 2014

(30) Foreign Application Priority Data

Jul. 18, 2012  (JP) ................................. 2012-159621
Jul. 18, 2012  (JP) ................................. 2012-159622

(51) Int. Cl.
*H03F 3/217* (2006.01)
*H04B 1/04* (2006.01)
*H01Q 1/32* (2006.01)
*H01Q 7/00* (2006.01)

(52) U.S. Cl.
CPC ............ *H03F 3/2173* (2013.01); *H04B 1/0458* (2013.01); *H01Q 1/3283* (2013.01); *H01Q 7/00* (2013.01)
USPC .......................................... 330/251; 330/146

(58) Field of Classification Search
USPC ................. 330/251, 207 A, 10, 146
See application file for complete search history.

(56) References Cited

U.S. PATENT DOCUMENTS

| | | | |
|---|---|---|---|
| 7,132,884 B2 * | 11/2006 | Ohkuri et al. | 330/10 |
| 7,271,545 B2 * | 9/2007 | Hu et al. | 315/209 CD |
| 7,813,755 B2 | 10/2010 | Ochi et al. | |
| 7,933,325 B2 | 4/2011 | Inaba et al. | |
| 8,319,447 B2 * | 11/2012 | Hasegawa et al. | 315/224 |
| 8,482,945 B2 * | 7/2013 | Kojima | 363/53 |
| 2006/0132325 A1 | 6/2006 | Fujii et al. | |
| 2006/0215028 A1 | 9/2006 | Abe et al. | |

(Continued)

FOREIGN PATENT DOCUMENTS

| JP | 2006-174154 A | 6/2006 |
|---|---|---|
| JP | 2006-238569 A | 9/2006 |

(Continued)

OTHER PUBLICATIONS

Partial European Search Report, dated Dec. 12, 2013, issued in corresponding European Patent Application No. 13176448.2.

*Primary Examiner* — Henry Choe
(74) *Attorney, Agent, or Firm* — Sughrue Mion, PLLC

(57) ABSTRACT

An antenna drive apparatus applying an antenna drive voltage to an antenna from an H-bridge circuit including four switching elements to drive the antenna, includes: a switching mechanism to switch between a full-bridge state in which a differential voltage between a pulse voltage and a reverse pulse voltage reversed from the pulse voltage is applied to the antenna as the antenna drive voltage, and a half-bridge state in which the pulse voltage or the reverse pulse voltage is applied to the antenna as the antenna drive voltage; and a control mechanism to control the switching mechanism so that the frequency of the full-bridge state per unit time during an initial period of driving of the antenna in a transmission period for transmitting a transmission signal by the antenna becomes higher than that during the subsequent period in the transmission period.

8 Claims, 10 Drawing Sheets

(56) References Cited

U.S. PATENT DOCUMENTS

| | | |
|---|---|---|
| 2009/0315682 A1 | 12/2009 | Leconte et al. |
| 2011/0285349 A1 | 11/2011 | Widmer et al. |
| 2012/0068548 A1 | 3/2012 | Endo et al. |

FOREIGN PATENT DOCUMENTS

| | | |
|---|---|---|
| JP | 2006-265956 A | 10/2006 |
| JP | 2009-84829 A | 4/2009 |
| JP | 4254674 B2 | 4/2009 |

* cited by examiner

ANTENNA DRIVE APPARATUS

CROSS REFERENCE TO RELATED APPLICATIONS

This application is based on and claims priority under 35 U.S.C. §119 to Japanese Patent Applications 2012-159621 and 2012-159622, both filed on Jul. 18, 2012, the entire content of which is incorporated herein by reference.

TECHNICAL FIELD

This disclosure relates to an antenna drive apparatus configured to apply a pulsed antenna drive voltage to an antenna to drive the antenna.

BACKGROUND DISCUSSION

In the related art, various types of antenna drive apparatuses are proposed. For example, an antenna drive apparatus disclosed in JP 2009-84829A (Reference 1) is configured to drive an antenna (LF antenna) by generating a pulsed antenna drive voltage by operating four switching elements which constitute an H-bridge circuit (a full-bridge circuit) by a drive circuit of an ECU and, and applying the antenna drive voltage to the antenna. There is proposed to equalize impedance values at two analogue circuit portions disposed with respect to both electric wires of a wire harness electrically connecting the ECU and the antenna for suppressing a leak or the like of an electromagnetic wave from the wire harness.

An antenna drive apparatus described in JP 2006-265956A (Reference 2) is configured to drive the antenna by the full-bridge circuit or a half-bridge circuit, and proposes applying a voltage shifted by half a wavelength (half a cycle) with respect to a normal antenna drive voltage when terminating the driving in order to shorten a falling time of an antenna current after the termination of the driving of the antenna. In this case, the falling time of a transmission signal from the antenna by the antenna current is shortened by an amount of shortening of the falling time of the antenna current. Accordingly, the period until the next transmission of the transmission signal may be shortened, so that the transmission speed of the transmission signal may be increased.

An antenna drive apparatus described in JP 2006-174154A (Reference 3) is configured to control an output strength of a transmission signal from an antenna by controlling a duty ratio of a carrier wave by an on-duty variable command which corresponds to a drive signal. Accordingly, even though individual antenna performances are varied, a required output strength is basically obtained without changing the circuit configuration.

However, in JP 2006-174154A (Reference 3), when an antenna having a great inductance and a high Q value is employed for example, even when the duty ratio of the carrier wave is controlled so as to obtain a required output strength, the rising time of the antenna current at the time of starting of the antenna driving may be increased. In this case, time required for the transmission signal from the antenna generated by the antenna current to reach the predetermined output strength which can be recognized on the side of a receiver is also increased, so that the transmission speed of the transmission signal is lowered.

In contrast, an antenna drive apparatus described in Japanese Patent No. 4254674 (Reference 4) is configured to monitor an output strength of a transmission signal from an antenna and control the duty ratio of a pulsed drive signal automatically according to the output strength. In this case, the raising time of the antenna current at the initial period of driving of the antenna can be shortened by controlling the duty ratio of the drive signal to increase the output strength if the output strength of the transmission signal from the antenna is small.

In JP 2009-84829A (Reference 1) and JP 2006-265956A (Reference 2), when the antenna having the great inductance and the high Q value is employed for example, the rising time of the antenna current at the time of starting of the antenna driving is increased. In this case, time required for the transmission signal from the antenna generated by the antenna current to reach the predetermined output strength which can be recognized on the side of a receiver is also increased, so that the transmission speed of the transmission signal is lowered.

Therefore, shortening the above-described rising time by increasing a source voltage for driving the antenna is conceivable. However, when the antenna is continued to be driven even after the rising of the antenna current by using the high voltage as described above, the output strength of the transmission signal from the antenna is excessively increased and a breach of Radio Act may result.

In Japanese Patent No. 4254674 (Reference 4), the output strength needs to be monitored when adjusting the output strength of the transmission signal from the antenna, so that complication of the circuit configuration and operational treatment is obliged.

SUMMARY

Thus, a need exists for an antenna drive apparatus which is not suspectable to the drawback mentioned above.

A first aspect of this disclosure is directed to an antenna drive apparatus configured to apply an antenna drive voltage to the antenna from an H-bridge circuit including four switching elements to drive the antenna, including: a switching mechanism configured to switch between a full-bridge state in which a differential voltage between a pulse voltage and a reverse pulse voltage reversed from the pulse voltage is applied to the antenna as the antenna drive voltage by the H-bridge circuit, and a half-bridge state in which the pulse voltage or the reverse pulse voltage is applied to the antenna as the antenna drive voltage by the H-bridge circuit; and a control mechanism configured to control the switching mechanism so that the frequency of the full-bridge state per unit time during an initial period of driving of the antenna in a transmission period for transmitting a transmission signal by the antenna becomes higher than that during the subsequent period subsequent to the initial period in the transmission period.

In this configuration, in the full-bridge state, the antenna drive voltage has double an amplitude of the pulse voltage (or a reverse pulse voltage), and hence the antenna current of the antenna to which the antenna drive voltage is to be applied is increased correspondingly. In contrast, in the half-bridge state, the antenna drive voltage has double an amplitude of the pulse voltage (or a reverse pulse voltage), and hence the antenna current of the antenna to which the antenna drive voltage is to be applied is reduced correspondingly.

In the initial period of driving of the antenna, the frequency of being in the full-bridge state per unit time is relatively large, and hence the rising time of the antenna current is shortened. In this case, time required for the transmission signal from the antenna generated by the antenna current to reach the predetermined output strength which can be recognized on the side of a receiver may be shortened, so that the transmission speed of the transmission signal is increased.

Also, in the subsequent period within the transmission period, since the frequency of being in the full-bridge state per unit time is relatively small, the increase of the antenna current is suppressed. In this case, the output strength of the transmission signal from the antenna by the antenna current may be suppressed from becoming excessively large.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

First Embodiment

An antenna drive apparatus of a smart entry system (registered trademark) configured to lock and unlock a vehicle door via a wireless communication with respect to a mobile unit carried by a vehicle user according to a first embodiment disclosed here will be described.

Figure 1:
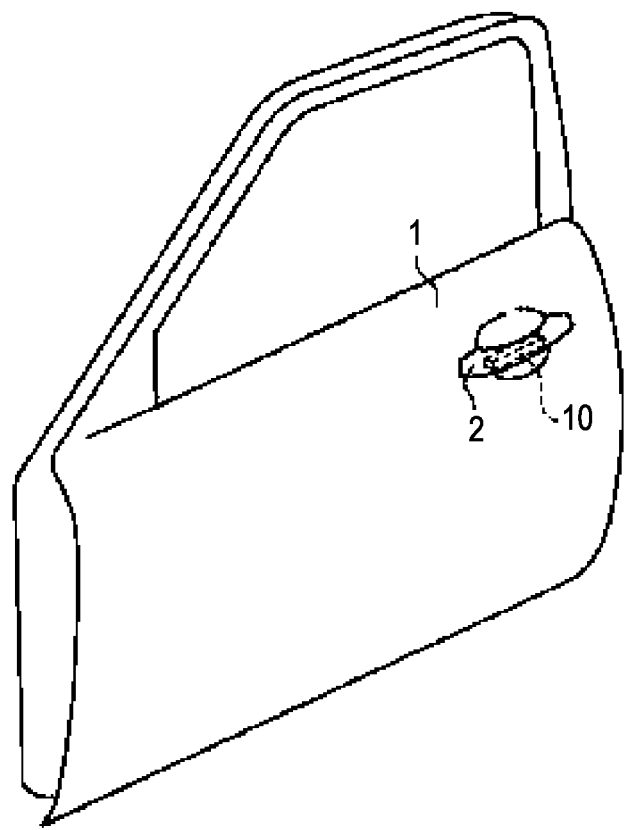
FIG. 1 is a perspective view illustrating a vehicle door.

As illustrated in FIG. 1, a door outer panel 1 which constitutes the vehicle door is provided with an outside door handle 2. The outside door handle 2 extends in the fore-and-aft direction of the vehicle, and is attached to the door outer panel 1 at two positions on the front and rear.

The outside door handle 2 is molded into a hollow shape having an internal space by using, for example, a resin material. The outside door handle 2 includes an antenna (LF antenna) 10 stored therein.

Subsequently, an electric configuration of the first embodiment will be described.

Figure 2:
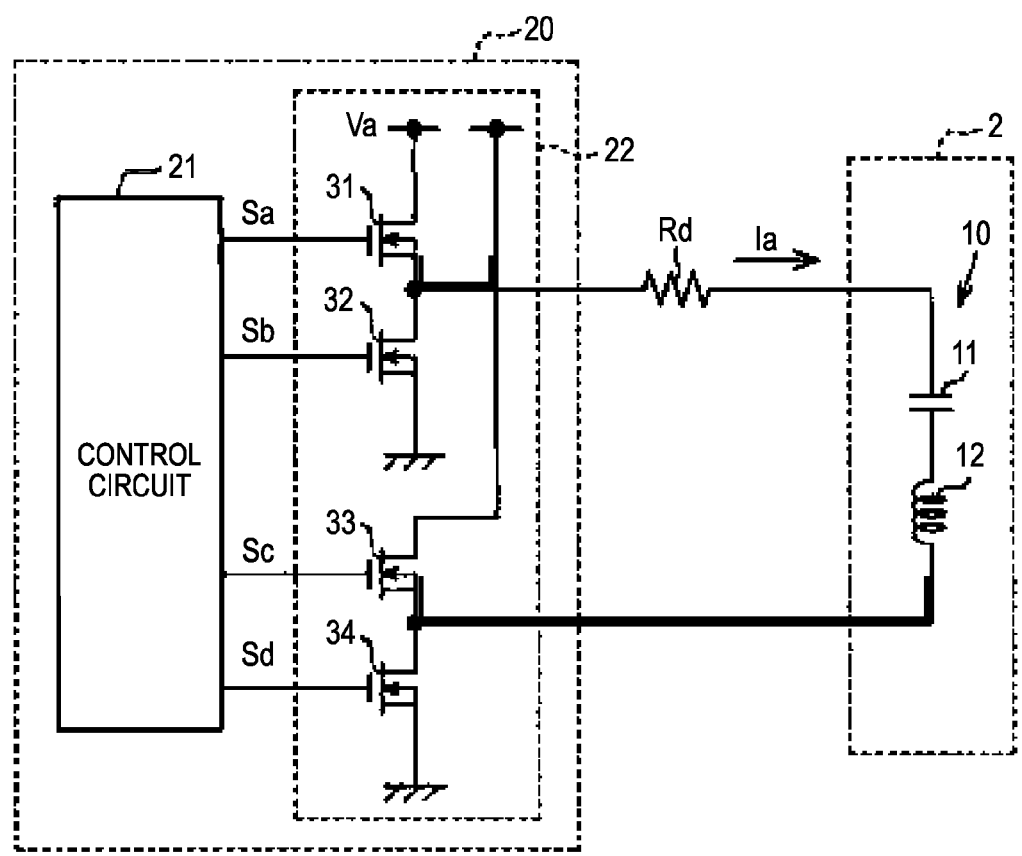
FIG. 2 is a circuit block diagram illustrating an electric configuration of a first embodiment disclosed here.

As illustrated in FIG. 2, the antenna drive apparatus includes the antenna 10 and a drive circuit 20 mounted on the vehicle body side for example. The drive circuit 20 is provided with a control circuit 21 configured mainly with a microcomputer, for example, and a H-bridge circuit 22.

The antenna 10 includes an antenna resonant capacitor 11 and a antenna coil 12 connected in series. The antenna resonant capacitor 11 and the antenna coil 12 constitute an LC series resonant circuit having a resonant frequency f.

The H-bridge circuit 22 includes four switching elements 31, 32, 33, and 34 including, for example, a nMOS transistor.

The switching element 31 is connected at its drain to an antenna power Va and at a source thereof to a drain of the switching element 32, and at a gate thereof to the control circuit 21. The switching element 32 is grounded at a source thereof and is connected at a gate thereof to the control circuit 21. A drain of the switching element 32 (and the source of the switching element 31) is connected to an end of the antenna resonant capacitor 11 via a resistance Rd for damping (for output adjustment).

In the same manner, the switching element 33 is connected at its drain to the antenna power Va and at a source thereof to a drain of the switching element 34, and also at a gate thereof to the control circuit 21. The switching element 34 is grounded at a source thereof and is connected at a gate thereof to the control circuit 21. A drain of the switching element 34 (and the source of the switching element 33) is connected to an end of the antenna coil 12.

The switching elements 31 to 34 (the H-bridge circuit 22) generate an antenna drive voltage Vd through the switching operation according to drive signals Sa, Sb, Sc, and Sd output from the control circuit 21 and applies the generated antenna drive voltage Vd to the antenna 10. Accordingly, an antenna current ia flows to the antenna 10, and a transmission signal (a wireless signal) is transmitted from the antenna 10 by an antenna current ia. The transmission signal is an inquiry signal (a request signal) to a mobile unit carried by a vehicle user for example, and the mobile unit having received the inquiry signal transmits a signal having an inherent ID code.

Figure 3:
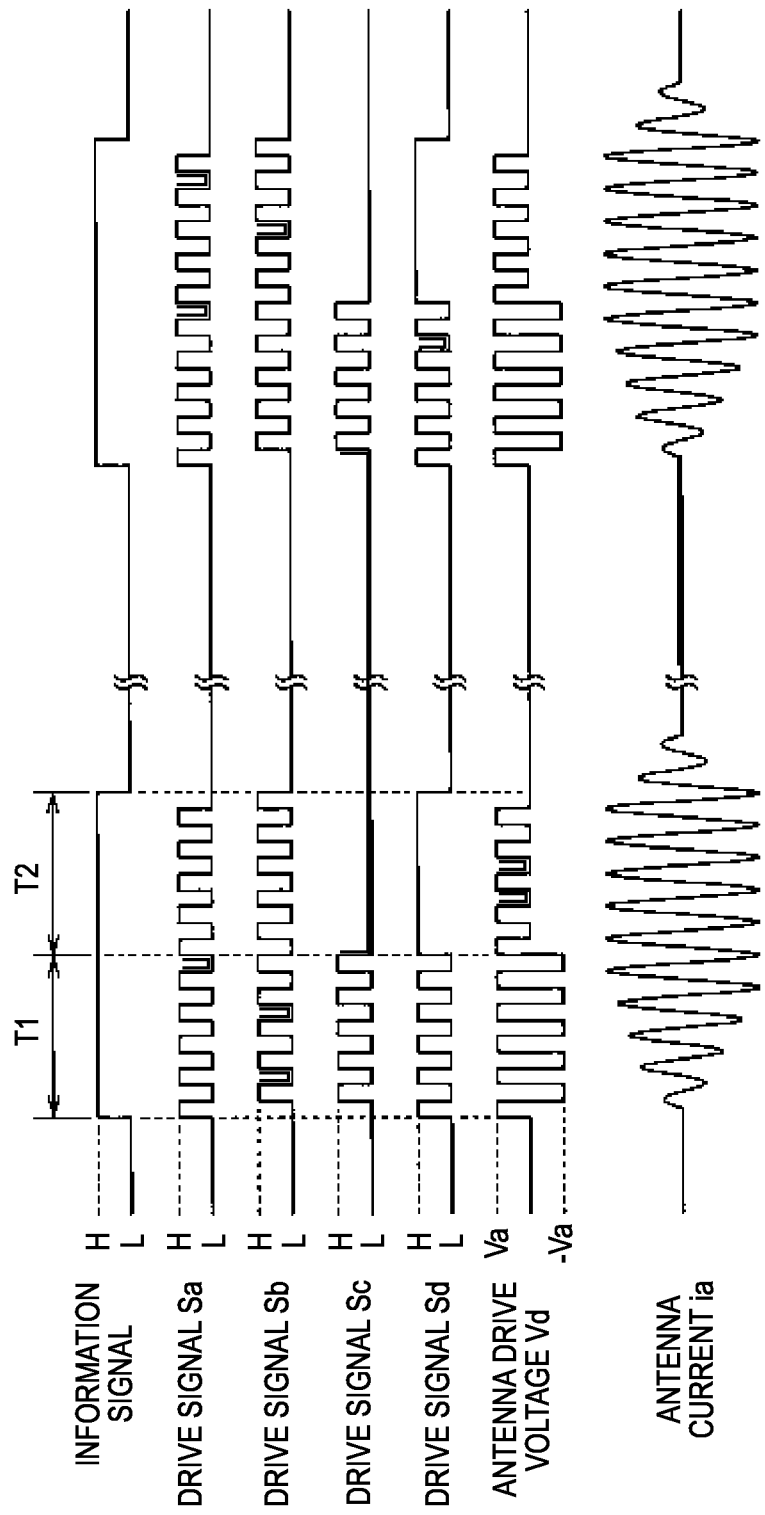
FIG. 3 is a time chart illustrating a driving control mode of the first embodiment disclosed here.

As illustrated in FIG. 3, an information signal relating to the generation of the transmission signal is generated in the control circuit 21, and is turned ON and OFF at a frequency sufficiently smaller than the resonant frequency f (switched between H (high) level and L (low) level). Then, in a rising period T1 corresponding to a period in which a predetermined period has elapsed from the start of the ON period of the information signal as the transmission term of the transmission signal, drive signals Sa and Sd repeat ON and OFF in a pulsed manner at a frequency which is coincident with the resonant frequency f. The drive signals Sb and Sc repeat ON and OFF in a pulsed manner so as to be a reverse polarity from the drive signals Sa and Sd (so as to invert a logic level) at a frequency which is coincident with the resonant frequency f.

Therefore, for example, it is assumed that the drive signal Sa and Sd are in the ON state and the drive signal Sb and Sc are in the OFF state. In this case, the antenna 10 (the antenna resonant capacitor 11) is connected to a antenna power Va via the resistance Rd and the switching element 31, and the antenna 10 (the antenna coil 12) is grounded via the switching element 34 by the ON operations of only the switching elements 31 and 34. The antenna power Va adjusted in output at the resistance Rd is applied to the antenna 10 as the antenna drive voltage Vd.

In contrast, it is assumed that the drive signal Sa and Sd are in the OFF state and the drive signal Sb and Sc are in the ON state. In this case, the antenna 10 (the antenna resonant capacitor 11) is grounded via the resistance Rd and the switching element 32, and the antenna 10 (the antenna coil 12) is connected to the antenna power Va via the switching element 33 by the ON operations of only the switching elements 32 and 33. The antenna power Va (=−Va) having a reverse polarity adjusted in output at the resistance Rd is applied to the antenna 10 as the antenna drive voltage Vd.

During the rising period T1, a differential voltage (=Vp−Vn) between the pulse voltage Vp having an amplitude matching the antenna power Va and the reverse pulse voltage Vn which is a reverse of the logic level of the pulse voltage Vp is applied to the antenna 10 as the antenna drive voltage Vd. At this time, the antenna drive voltage Vd is switched between the antenna power Va and an antenna power −Va having a reverse polarity within a cycle corresponding to the resonant frequency f (a full-bridge state).

The output strength of the transmission signal from the antenna 10 by the antenna current ia is set so as not to breach Radio Act even in the terminal period of the rising period T1 when the antenna current ia of the antenna 10 to which the antenna drive voltage Vd in the full-bridge state is applied is raised to a maximum. In other words, the rising period T1 is set by considering a restriction on the basis of Radio Act.

During the stationary period T2 as a period after the rising period T1 within the ON period of the information signal, the drive signal Sa repeats ON and OFF in a pulsed manner at a frequency corresponding to the resonant frequency f, and the drive signal Sd is maintained in the ON state. The drive signal Sb repeats ON and OFF in a pulsed manner so as to be a reverse polarity from the drive signals Sa (so as to invert a logic level) at a frequency which is coincident with the resonant frequency f and the drive signal Sc is maintained in the OFF state.

Therefore, it is assumed that the drive signal Sa is in the ON state and the drive signal Sb is in the OFF state. In this case, the antenna 10 (the antenna resonant capacitor 11) is connected to the antenna power Va via the resistance Rd and the switching element 31, and the antenna 10 (the antenna coil 12) is grounded via the switching element 34 by the ON operations of only the switching elements 31 and 34. The antenna power Va adjusted in output at the resistance Rd is applied to the antenna 10 as the antenna drive voltage Vd.

In contrast, it is assumed that the drive signal Sa is in the OFF state and the drive signal Sb is in the ON state. In this case, the antenna 10 (the antenna resonant capacitor 11) is grounded via the resistance Rd and the switching element 32, and the antenna 10 (the antenna coil 12) is grounded via the switching element 34 by the ON operations of only the switching elements 32 and 34. Then, a ground voltage (=0) is applied to the antenna 10 as the antenna drive voltage Vd.

In other words, during the stationary period T2, the pulse voltage Vp having an amplitude matching the antenna power Va is applied to the antenna 10 as the antenna drive voltage Vd. At this time, the antenna drive voltage Vd is switched between the antenna power Va and the ground voltage within a cycle corresponding to the resonant frequency f (the half-bridge state). In the half-bridge state, the output strength of the transmission signal from the antenna 10 by the antenna current ia of the antenna 10 to which the antenna drive voltage Vd is applied is set so as not to breach the Radio Act.

Subsequently, the operation of the first embodiment will be described.

In the full-bridge state, the antenna drive voltage Vd has double an amplitude of the pulse voltage Vp, and hence the antenna current ia of the antenna 10 to which the antenna drive voltage Vd is to be applied is increased relatively. In contrast, in the half-bridge state, the antenna drive voltage Vd has the same amplitude as that of the pulse voltage Vp, and hence the antenna current ia of the antenna 10 to which the antenna drive voltage Vd is to be applied is reduced relatively.

In contrast, in the full-bridge state, a double antenna current ia can be flowed in comparison with the half-bridge state, and the output strength of the transmission signal from the antenna 10 is also doubled (increase by 6 dB). It is needless to say that the switching between the full-bridge state and the half-bridge state can be performed by the control circuit 21 (the switching mechanism).

Then, during the rising period T1, the antenna drive voltage Vd is generated all in the full-bridge state, and during the subsequent stationary period T2, the antenna drive voltage Vd is generated all in the half-bridge state. In other words, the frequency of the full-bridge state per unit time is set to be larger during the rising period T1 than the subsequent stationary period T2 (control mechanism).

Therefore, since it is all the full-bridge state during the rising period T1 (the frequency of being in the full-bridge state per unit time is relatively large), the rising time of the antenna current ia is shortened.

Also, during the subsequent stationary period T2, since it is all the half-bridge state in the rising period T2 (the frequency of being in the full-bridge state per unit time is relatively small), the increase of the antenna current ia is sunk down. It is needless to say that the output strength of the transmission signal from the antenna 10 by the antenna current ia that maintains the steady state does not breach Radio Act.

As described above in detail, the following advantages are achieved according to the first embodiment.

(1) In the first embodiment, the frequency of being in the full-bridge state per unit time is relatively large, and hence the rising time of the antenna current ia is shortened during the rising period T1. In this case, time required for the transmission signal from the antenna 10 generated by the antenna current ia to reach the predetermined output strength which can be recognized on the side of a receiver (mobile apparatus) may be shortened, so that the transmission speed of the transmission signal is increased.

Also, during the subsequent stationary period T2, since the frequency of being in the full-bridge state per unit time is relatively small, the increase of the antenna current ia is sunk down. In this case, the output strength of the transmission signal from the antenna 10 by the antenna current ia may be suppressed from becoming excessively large, and conformity of Radio Act is achieved. The output strength of the transmission signal from the antenna 10 may be suppressed, a communication area is prevented from becoming excessively large, and the security properties may be maintained.

(2) In the first embodiment, the control circuit 21 is configured to achieve only the full-bridge state during the rising period T1 and only the half-bridge state during the subsequent stationary period T2. Therefore, since the number of times of switching operations between the full-bridge state and the half-bridge state may be only once within the ON period (the transmission period) of the information signal, the operation load of the control circuit 21 may be alleviated.

(3) In the first embodiment, at a time point when the elapsed time from the start of the ON period (the transmission period) of the information signal exceeds the predetermined period and reaches the terminal of the rising period T1, the state is switched from the full-bridge state to the half-bridge state to suppress increase of the antenna current ia. Therefore, since the control circuit 21 basically needs only to monitor the elapsed time, the operation load of the control circuit 21 may be alleviated.

(4) In the first embodiment, the drive circuit 20 is capable of switching the state between the full-bridge state and the half-bridge state in an extremely simple circuit configuration such as controlling the switching actions of the plurality of the switching elements 31 to 34 of the H-bridge circuit 22.

(5) In the first embodiment, the usage of the antenna 10 having a higher Q value is enabled by being capable of shortening the rising time of the antenna current ia.

Accordingly, the antenna coil 12 having a large inductance, that is, the antenna coil 12 (antenna 10) having a shorter coil length and compact form may be employed, and the mountability of the antenna 10 in the outside door handle 2 may be improved. Also, since the antenna current ia may be reduced, the power consumption may be reduced.

(6) An upper limit of the output strengths of the antenna 10 is defined by Radio Acts of the respective countries. However, by switching between the full-bridge state and the half-bridge state, conformity of the corresponding Radio Acts is achieved while improving the rising property of the antenna current ia.

Second Embodiment

Figure 4:
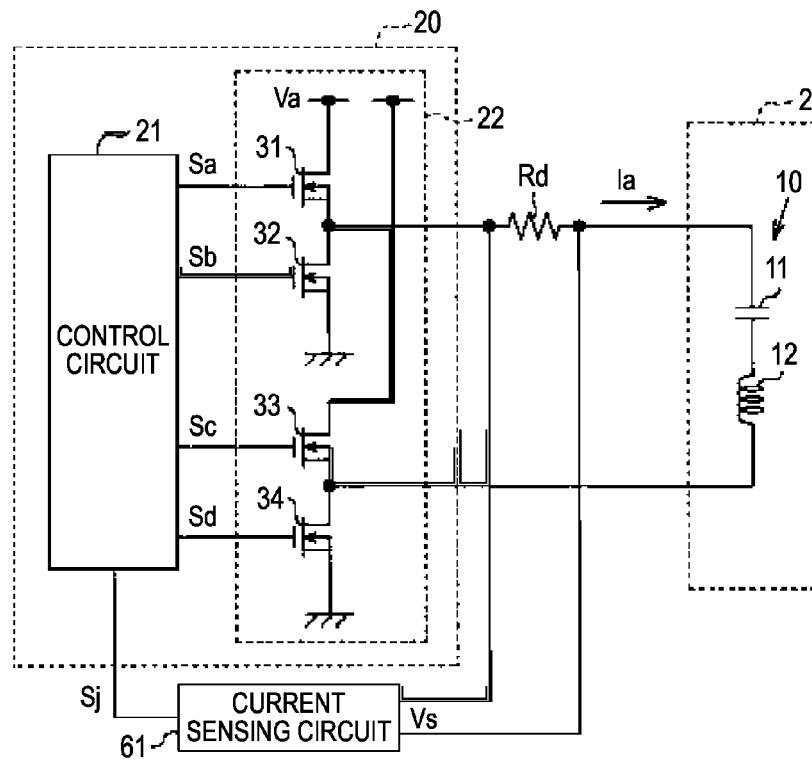
FIG. 4 is a circuit block diagram illustrating the electric configuration of a second embodiment disclosed here.

Referring now to FIG. 4, a second embodiment disclosed here will be described. The second embodiment has a configuration different from the first embodiment in that the antenna current ia of the antenna 10 is monitored, and the state is switched between the full-bridge state and the half-bridge state on the basis of the result of monitoring, and hence the detailed description of the same portion is omitted.

As illustrated in FIG. 4, both ends of the resistance Rd are connected respectively to a current sensing circuit 61 which constitutes a sensing mechanism, and the current sensing circuit 61 is connected to the control circuit 21.

The current sensing circuit 61 includes, for example, a comparator integrated therein, and is configured to compare a sensed voltage (effective value) Vs between the both ends of the resistance Rd and a predetermined threshold voltage Vth (for example, a voltage between the both ends of the resistance Rd (effective value) corresponding to the antenna current ia when the stationary state is maintained in the half-bridge state). Then, the current sensing circuit 61 outputs a determination signal Sj switched in logic level (ON/OFF) to the control circuit 21 by an inversion of the magnitude of the sensed voltage Vs and the threshold voltage Vth.

For example, the determination signal Sj is brought into the OFF state when the sensed voltage Vs is smaller than the threshold voltage Vth, and into the ON state when the sensed voltage Vs is not lower than the threshold voltage Vth. Therefore, basically, the determination signal Sj is brought into the OFF state because the rising of the antenna current ia is not sufficient and the sensed voltage Vs is also low during the initial ON period of the information signal, and is switched to the ON state in association with the rising of the antenna current ia.

Therefore, the control circuit 21 is configured to make the frequency of the full-bridge state per unit time become relatively low when the determination signal Sj is in the OFF state and, in contrast, relatively high when the determination signal Sj is in the ON state during the ON period of the information signal. Specifically, the control circuit 21 is configured to cause the full-bridge state always when the determination signal Sj is in the OFF state and, in contrast, cause the half-bridge state always when the determination signal Sj is in the ON state during the ON period of the information signal.

Therefore, in a normal state, the full-bridge state is set in accordance with the fact that the rising of the antenna current ia is not sufficient during the initial ON period of the information signal, so that the rising time of the antenna current ia is shortened. Subsequently, when the antenna current ia is raised, the half-bridge state is set correspondingly, and an increase in the antenna current ia is suppressed.

As described above in detail, the following advantages are achieved according to the second embodiment in addition to the effects of (1), (2), and (4) to (6) of the first embodiment.

(1) In the second embodiment, the control circuit 21 suppresses the increase of the antenna current ia at a time point when the sensed voltage Vs reaches or exceeds the threshold voltage Vth, that is, at a time point when the rising of the antenna current ia is actually confirmed. Therefore, for example, increase of the antenna current ia in the state of insufficient rising of the antenna current ia or excessive increase of the antenna current ia are suppressed.

Third Embodiment

Figure 5:
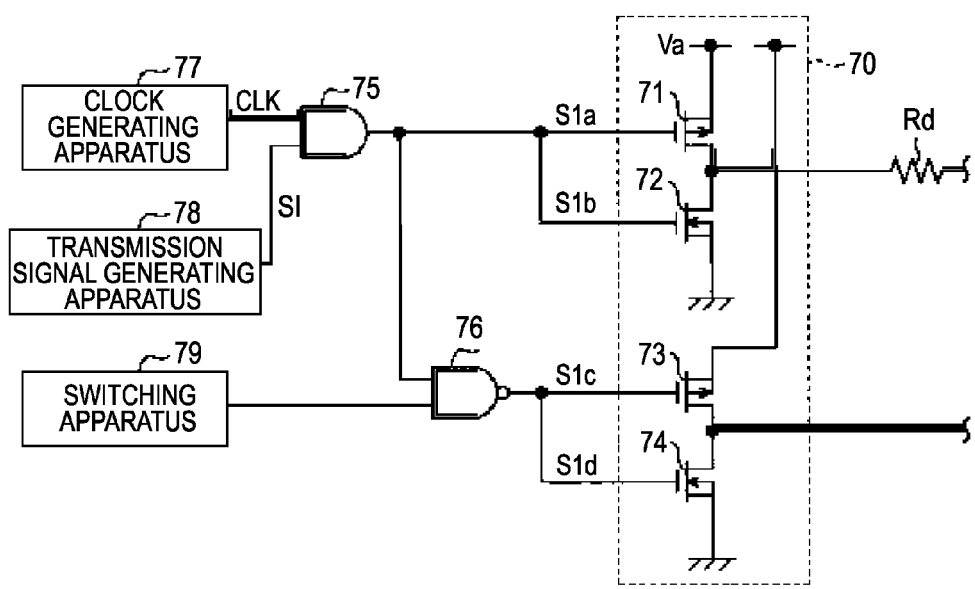
FIG. 5 is a circuit block diagram illustrating the electric configuration of a third embodiment disclosed here.
Figure 6:
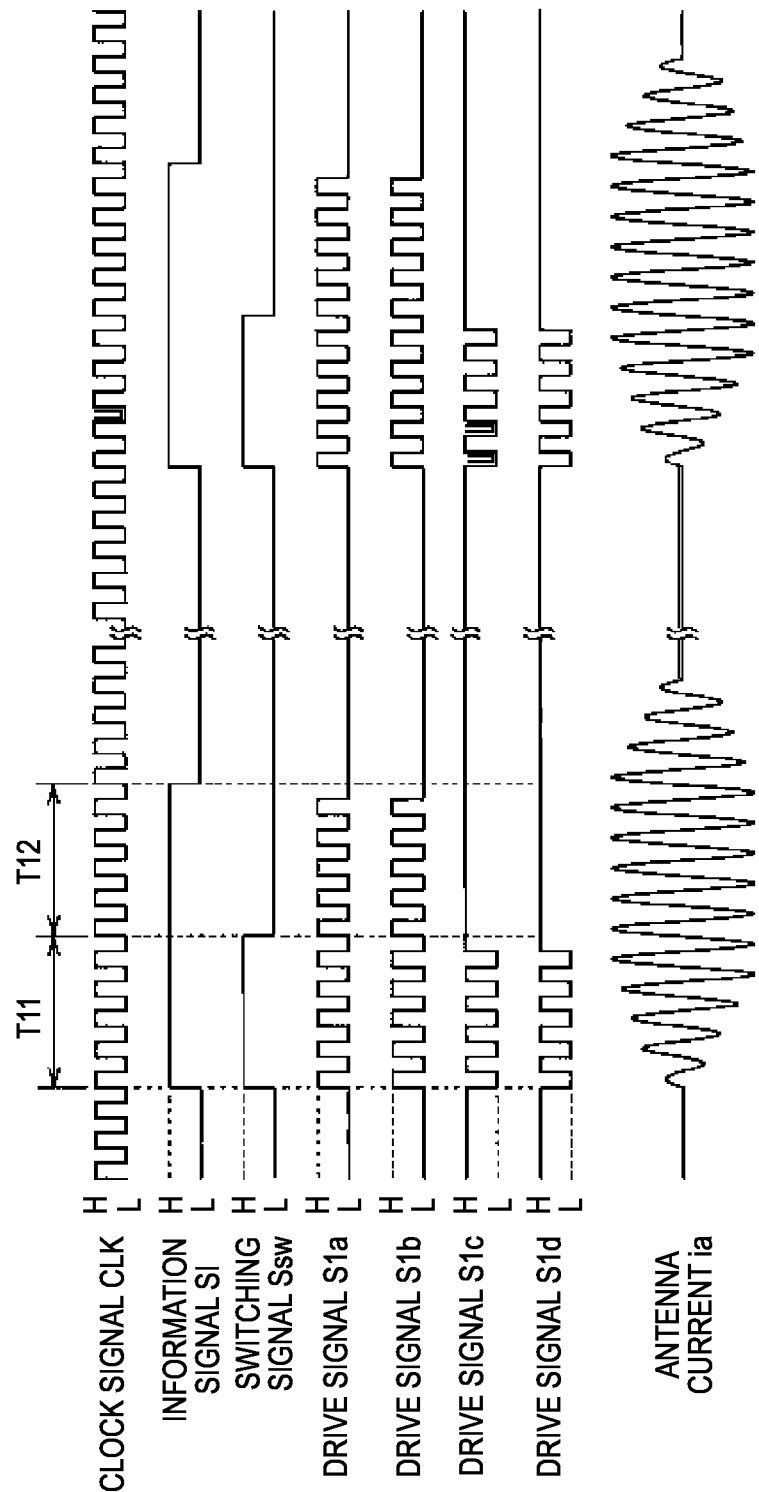
FIG. 6 is a time chart illustrating the driving control mode of the third embodiment disclosed here.

Referring now to FIG. 5 to FIG. 6, a third embodiment disclosed here will be described. The third embodiment has a configuration in which the switching between the full-bridge state and the half-bridge state of the first embodiment is changed to be realized by the logical circuit, and hence the detailed description of the same portion is omitted.

As illustrated in FIG. 5, an H-bridge circuit 70 of the third embodiment includes two switching elements 71 and 73 each including, for example, a pMOS transistor and two switching elements 72 and 74 each including a nMOS transistor.

The switching element 71 is connected at its source to the antenna power Va and at a drain thereof to a drain of the switching element 72, and at a gate thereof to an output terminal of an AND circuit 75. The switching element 72 is grounded at a source thereof and is connected at a gate thereof to the output terminal of the AND circuit 75. A drain of the switching element 72 (and the drain of the switching element 71) is connected to an end of the antenna resonant capacitor 11 via a resistance Rd.

In the same manner, the switching element 73 is connected at its source to the antenna power Va and also at a drain thereof to a drain of the switching element 74, and at a gate thereof to the output terminal of a NAND circuit 76. The switching element 74 is grounded at a source thereof and is connected at a gate thereof to the output terminal of the NAND circuit 76. A drain of the switching element 74 (and the drain of the switching element 73) is connected to an end of the antenna coil 12.

The two input terminals of the AND circuit 75 are respectively connected to a clock generating apparatus 77 and a transmission signal generating apparatus 78, and two input terminals of the NAND circuit 76 are respectively connected to the output terminal of the AND circuit 75 and the switching apparatus 79 as a switching mechanism.

As illustrated in FIG. 6, the clock generating apparatus 77 generates a clock signal CLK which repeats ON and OFF (switches in level between H-level and L-level) in a pulsed manner at a frequency coincident with the resonant frequency f and outputs the generated clock signal CLK to one of the input terminals of the AND circuit 75. The transmission signal generating apparatus 78 generates an information signal SI turned ON and OFF at a sufficiently low frequency in comparison with the resonant frequency f, and outputs the generated information signal SI to the other input terminal of the AND circuit 75.

Therefore, the AND circuit 75 generates the clock signal CLK and the output signal which becomes a logical AND of the information signal SI, and outputs the generated signals to gates of the switching elements 71 and 72 as the drive signals S1a and S1d. Accordingly, the drive signals S1a and S1d repeat ON and OFF in a pulsed manner at a frequency which is coincident with the resonant frequency f in accordance with the ON period of the information signal as the transmission period for transmitting the transmission signal. It is needless to say that the switching elements 71 and 72 are turned ON and OFF at timing different from each other by the same drive signals S1a and S1d being output to the respective gates.

In contrast, the switching apparatus 79 generates a switching signal Ssw which is turned into the ON state and outputs the generated switching signal Ssw to the other input terminal of the NAND circuit 76 during the rising period T11 corresponding to a period in which a predetermined period has elapsed from the start of the ON period of the information signal SI.

Therefore, the NAND circuit 76 generates the output signal of the AND circuit 75 (the drive signals S1a and S1d) and the output signal which becomes an inversion logic of a logical AND of the switching signal Ssw, and outputs respectively to the gates of the switching elements 73 and 74 as the drive signals S1c and S1b. Accordingly, the drive signals S1c and S1d repeat On and OFF in a pulsed manner so as to be a reverse polarity (so as to invert the logic level) from the drive signals S1a to S1d synchronously with the ON period of the switching signal Ssw and maintain the ON state synchronously the OFF period of the switching signal Ssw. It is needless to say that the switching elements 73 and 74 are turned ON and OFF at timing different from each other by the same drive signals S1c and S1d being output to the respective gates.

Here, it is assumed that the drive signal S1a and S1b are in the ON state and the drive signal S1c and S1d are in the OFF state. In this case, the antenna 10 (the antenna resonant capacitor 11) is grounded via the resistance Rd and the switching element 72, and the antenna 10 (the antenna coil 12) is connected to the antenna power Va via the switching element 73 by the ON operations of only the switching elements 72 and 73. The antenna power Va (=-Va) having a reverse polarity adjusted in output at the resistance Rd is applied to the antenna 10 as the antenna drive voltage Vd.

In contrast, it is assumed that the drive signal S1a and S1b are in the OFF state and the drive signal S1c and S1d are in the ON state. In this case, the antenna 10 (the antenna resonant capacitor 11) is connected to the antenna power Va via the resistance Rd and the switching element 71, and the antenna 10 (the antenna coil 12) is grounded via the switching element 74 by the ON operations of only the switching elements 71 and 74. The antenna power Va adjusted in output at the resistance Rd is applied to the antenna 10 as the antenna drive voltage Vd.

It is also assumed that all the drive signals S1a to S1d are in the ON state. In this case, the antenna 10 (the antenna resonant capacitor 11) is grounded via the resistance Rd and the switching element 72, and the antenna 10 (the antenna coil 12) is grounded via the switching element 74 by the ON operations of only the switching elements 72 and 74. Then, the ground voltage (=0) is applied to the antenna 10 as the antenna drive voltage Vd.

During the rising period T11, the differential voltage (=Vp−Vn) between the pulse voltage Vp having an amplitude matching the antenna power Va and the reverse pulse voltage Vn which is a reverse of the logic level of the pulse voltage Vp is applied to the antenna 10 as the antenna drive voltage Vd. At this time, the antenna drive voltage Vd is switched between the antenna power Va and the antenna power −Va having a reverse polarity within a cycle corresponding to the resonant frequency f (the full-bridge state).

The output strength of the transmission signal from the antenna 10 by the antenna current ia is set so as not to breach Radio Act even in the terminal period of the rising period T11 when the antenna current ia of the antenna 10 to which the antenna drive voltage Vd in a full-bridge state is applied is raised to a maximum. In other words, the rising period T11 is set by considering a restriction on the basis of Radio Act.

In other words, in the stationary period T12, which is a period after the rising period T11 within the ON period of the information signal, the reverse pulse voltage Vn having an amplitude matching the antenna power Va is applied to the antenna 10 as the antenna drive voltage Vd. At this time, the antenna drive voltage Vd is switched between the antenna power −Va having a reverse polarity and the ground voltage within a cycle corresponding to the resonant frequency f (half bridge state). In the half bridge state, the output strength of the transmission signal from the antenna 10 by the antenna current ia of the antenna 10 to which the antenna drive voltage Vd is applied is set so as not to breach the Radio Act.

As described above in detail, the same advantages as those in the first embodiment are achieved according to the third embodiment.

Fourth Embodiment

Figure 8:
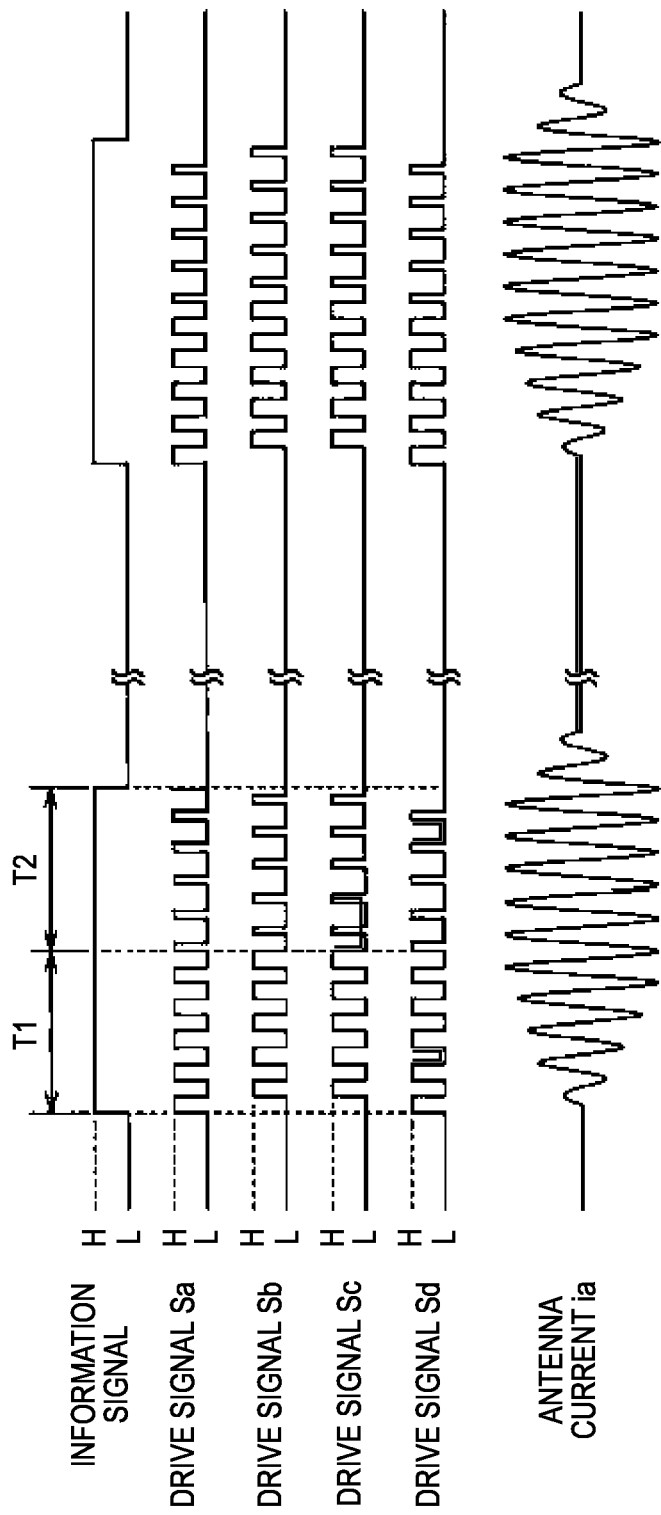
FIG. 8 is a time chart illustrating the driving control mode according to a fourth embodiment disclosed here.
Figure 9:
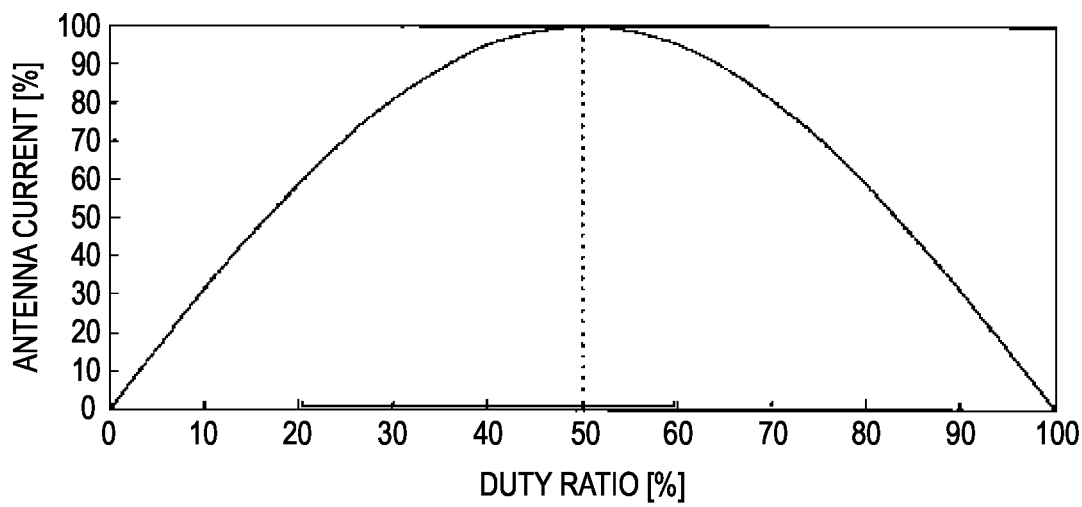
FIG. 9 is a graph illustrating a relationship between a duty ratio and an antenna current.
Figure 10:
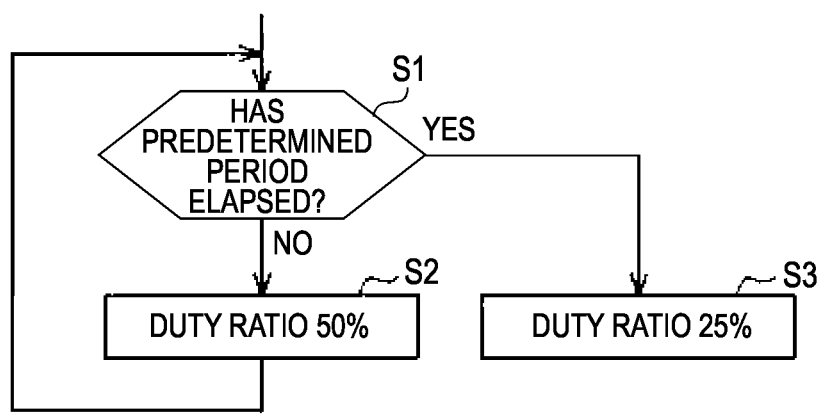
FIG. 10 is a flowchart illustrating the drive control mode of the fourth embodiment disclosed here.

Referring now to FIG. 8 to FIG. 10, a fourth embodiment disclosed here will be described. An electrical configuration of the fourth embodiment is the same as that illustrated in FIG. 2, detailed description will be omitted.

As illustrated in FIG. 8, an information signal relating to the generation of the transmission signal is generated in the control circuit 21, and is turned ON and OFF at a frequency sufficiently smaller than the resonant frequency f (switched between H (high) level and L (low) level). Then, in the ON period of the information signal as the transmission period for transmitting the transmission signal, the drive signal Sa and Sd repeat ON and OFF in a pulsed manner at a frequency which is coincident with the resonant frequency f, and the drive signals Sb and Sc repeat ON and OFF in a pulsed manner out of alignment with the drive signals Sa and Sd by ½ the cycle (half cycle) corresponding to the resonant frequency f at a frequency which is coincident with the resonant frequency f.

Then, during the rising period T1 corresponding to a period in which a predetermined period has elapsed from the start of the ON period of the information signal, the drive signals Sa to Sd are turned ON during ½ the cycle corresponding to the resonant frequency f, and is turned oFF during the remaining ½ the cycle. In other words, the duty ratios indicating the ON state of the drive signals Sa to Sd in the cycle corresponding to the resonant frequency f are set respectively to 50% (½) as a predetermined initial duty ratio.

Therefore, it is assumed that the drive signal Sa and Sd are in the ON state and the drive signal Sb and Sc are in the OFF state. In this case, the antenna 10 (the antenna resonant capacitor 11) is connected to a antenna power Va via the resistance Rd and the switching element 31, and the antenna 10 (the antenna coil 12) is grounded via the switching element 34 by the ON operations of only the switching elements 31 and 34. The antenna power Va adjusted in output at the resistance Rd is applied to the antenna 10 as the antenna drive voltage Vd.

In contrast, it is assumed that the drive signal Sa and Sd are in the OFF state and the drive signal Sb and Sc are in the ON state. In this case, the antenna 10 (the antenna resonant capacitor 11) is grounded via the resistance Rd and the switching element 32, and the antenna 10 (the antenna coil 12) is connected to the antenna power Va via the switching element 33 by the ON operations of only the switching elements 32 and 33. The antenna power Va (=-Va) having a reverse polarity adjusted in output at the resistance Rd is applied to the antenna 10 as the antenna drive voltage Vd.

In other words, during the rising period T1, an antenna power Va (or the antenna power −Va having the reverse polarity) is applied as the antenna drive voltage Vd at a cycle corresponding to ½ the resonant frequency f (duty ratio 50%) to the antenna 10.

Also, during the stationary period T2 which is a period after the rising period T1 within the ON period of the information signal, the drive signals Sa to Sd are turned ON during ¼ the cycle corresponding to the resonant frequency f, and is turned oFF during the remaining ¾ the cycle. In other words, the duty ratios indicating the ON state of the drive signals Sa to Sd in the cycle corresponding to the resonant frequency f are set set respectively to 25% (¼) as a predetermined duty ratio.

Therefore, when the drive signals Sa and Sd are in the ON state and the drive signals Sb and Sc are in the OFF state, for example, the antenna power Va adjusted in output at the resistance Rd is applied to the antenna 10 as the antenna drive voltage Vd in the manner described above. In contrast, when the drive signals Sa and Sd are in the OFF state and the drive signals Sb and Sc are in the ON state, the antenna power Va having the reverse polarity (=−Va) adjusted in output at the resistance Rd is applied to the antenna 10 as the antenna drive voltage Vd in the manner described above.

When all the drive signals Sa to Sd are in the OFF state, all the switching elements 31 to 34 are turned OFF and hence the antenna 10 is cut off the antenna power Va.

In other words, during stationary period T2, the antenna power Va (or the antenna power −Va having the reverse polarity) is applied as the antenna drive voltage Vd at a cycle corresponding to ¼ the resonant frequency f (duty ratio 25%) to the antenna 10.

The control circuit 21 counts an elapsed time from the start of the ON period of the information signal by a timer integrated therein.

Here, the relationship between the duty ratios of the drive signals Sa to Sd and the effective value of the antenna current ia correlated with the antenna drive voltage Vd applied to the antenna 10 (more strictly, the effective value of the antenna current ia expressed by 100% when the duty ratio is 50%) will be described.

As illustrated in FIG. 9, it is confirmed that the antenna current ia increases as the duty ratios of the drive signals Sa to Sd get closer to 50%, and continues to be reduced monotonously as it gets away from 50% to the plus side or the minus side. The antenna current ia reduces symmetrically so that the duty ratios of the drive signals Sa to Sd become the maximum (100%) when the duty ratio is 50%.

Therefore, during the rising period T1, the duty ratios of the drive signals Sa to Sd are set to 50%, and hence the rising time of the antenna current ia is shortened. Even when the duty ratios of the drive signals Sa to Sd are set to 50% and the antenna current ia of the antenna 10 is at the terminal period of the rising period T1 which is raised to the maximum, the output strength of the transmission signal from the antenna 10 by the antenna current ia is set so as not to breach Radio Act. In other words, the rising period T1 is set by considering a restriction on the basis of Radio Act.

Therefore, during the stationary period T2, the duty ratios of the drive signals Sa to Sd are set to 25%, and hence increase of the antenna current ia is suppressed. When the duty ratios of the drive signals Sa to Sd are set to 25%, the output strength of the transmission signal from the antenna 10 by the antenna current ia is set so as not to breach Radio Act.

Subsequently, the control mode of the duty ratios of the drive signals Sa to Sd by the control circuit 21 will be described briefly. This process is activated by the start of the ON period of the information signal (switching from OFF to ON).

As illustrated in FIG. 10 when the process proceeds to this routine, the control circuit 21 determines whether or not the elapsed time from the start of the ON period of the information signal reaches a predetermined period (that is, whether the rising period T1 or the stationary period T2) (S1). When the elapsed time from the start of the ON period of the information signal is determined not to reach the predetermined period, the control circuit 21 sets the duty ratios of the drive signals Sa to Sd to 50% as being in the rising period T1 (S2). In contrast, when the elapsed time from the start of the ON period of the information signal is determined to reach the predetermined period, the control circuit 21 sets the duty ratios of the drive signals Sa to Sd to 25% as being in the stationary period T2 (S3).

Therefore, the process to be performed by the control circuit 21 basically includes only the monitoring of the elapsed time from the start of the ON period of the information signal and switching of the duty ratios of the drive signals Sa to Sd when the elapsed time reaches the predetermined period.

Subsequently, the operation of the fourth embodiment embodiment disclosed here will be described.

In a state in which the duty ratios of the drive signals Sa to Sd are 50%, the antenna current ia of the antenna 10 is increased (maximized). In contrast, in a state in which the duty ratios of the drive signals Sa to Sd are 25%, the antenna current ia of the antenna 10 is relatively decreased. Specifically, in the state in which the duty ratio is 25%, the antenna current ia is reduced approximately by 30% in comparison with a state in which the duty ratio is 50%.

During the rising period T1, all the duty ratios of the drive signals Sa to Sd are set to 50%, and all the duty ratios of the drive signals Sa to Sd are set to 25% during the subsequent stationary period T2. In other words, an average value (50%) of the duty ratios of the drive signals Sa to Sd during the rising period T1 is controlled to be close to 50% than the duty ratio of the drive signals Sa to Sd during the subsequent stationary period T2 (25%) (control mechanism).

Therefore, during the rising period T1, since all the duty ratios of the drive signals Sa to Sd are 50%, the rising time of the antenna current ia is shortened.

During the subsequent stationary period T2, since all the duty ratios of the drive signals Sa to Sd are set to 25%, increase of the antenna current ia is suppressed. It is needless to say that the output strength of the transmission signal from the antenna 10 by the antenna current ia that maintains the steady state does not breach Radio Act.

As described above in detail, the following advantages are achieved according to the fourth embodiment.

(1) According to the fourth embodiment, since all the duty ratios of the drive signals Sa to Sd are 50% during the rising period T1 (the average value of the duty ratio is relatively close to 50%), the rising time of the antenna current ia is shortened. In this case, time required for the transmission signal from the antenna 10 generated by the antenna current ia to reach the predetermined output strength which can be recognized on the side of a receiver may be shortened, so that the transmission speed of the transmission signal is increased.

Since all the duty ratios of the drive signals Sa to Sd are 25% during the subsequent stationary period T2 (the duty ratio is relatively far from 50%), increase of the antenna current ia is suppressed. In this case, the output strength of the transmission signal from the antenna 10 by the antenna current ia may be suppressed from becoming excessively large, and conformity of Radio Act is achieved. The output strength of the transmission signal from the antenna 10 may be suppressed, a communication area is prevented from becoming excessively large, and the security properties may be maintained.

Furthermore, since the control circuit 21 is only required to monitor the elapsed time from the start of driving of the antenna 10 (elapsed situation) and set the duty ratios of the drive signals Sa to Sd to 25% when reaching the predetermined period, the operation load of the control circuit 21 may be reduced, and hence the cost may be reduced.

(2) According to the fourth embodiment, since the control circuit 21 is required only to switch the duty ratios of the drive signals Sa to Sd either 50% or 25% during the rising period T1 and the stationary period T2, the operation load of the control circuit 21 is further reduced.

(3) According to the fourth embodiment disclosed here, the usage of the antenna 10 having a higher Q value is enabled by being capable of shortening the rising time of the antenna current ia.

Accordingly, the antenna coil 12 having a large inductance, that is, the antenna coil 12 (antenna 10) having a shorter coil length and compact form may be employed, and the mountability of the antenna 10 in the outside door handle 2 may be improved. Also, since the antenna current ia may be reduced, the power consumption may be reduced.

(4) An upper limit of the output strengths of the antenna 10 is defined by Radio Acts of the respective countries. However, by changing the duty ratios of the drive signals Sa to Sd, conformity of the corresponding Radio Acts is achieved while improving the rising property of the antenna current ia.

(5) According to the fourth embodiment, since all the duty ratios of the drive signals Sa to Sd are 50% during the rising period T1, the rising time of the antenna current ia is minimized.

(6) According to the fourth embodiment, the output strength of the antenna 10 may be stabilized by maintaining the stationary state of the antenna current ia during the stationary period T2.

Fifth Embodiment

Figure 11:
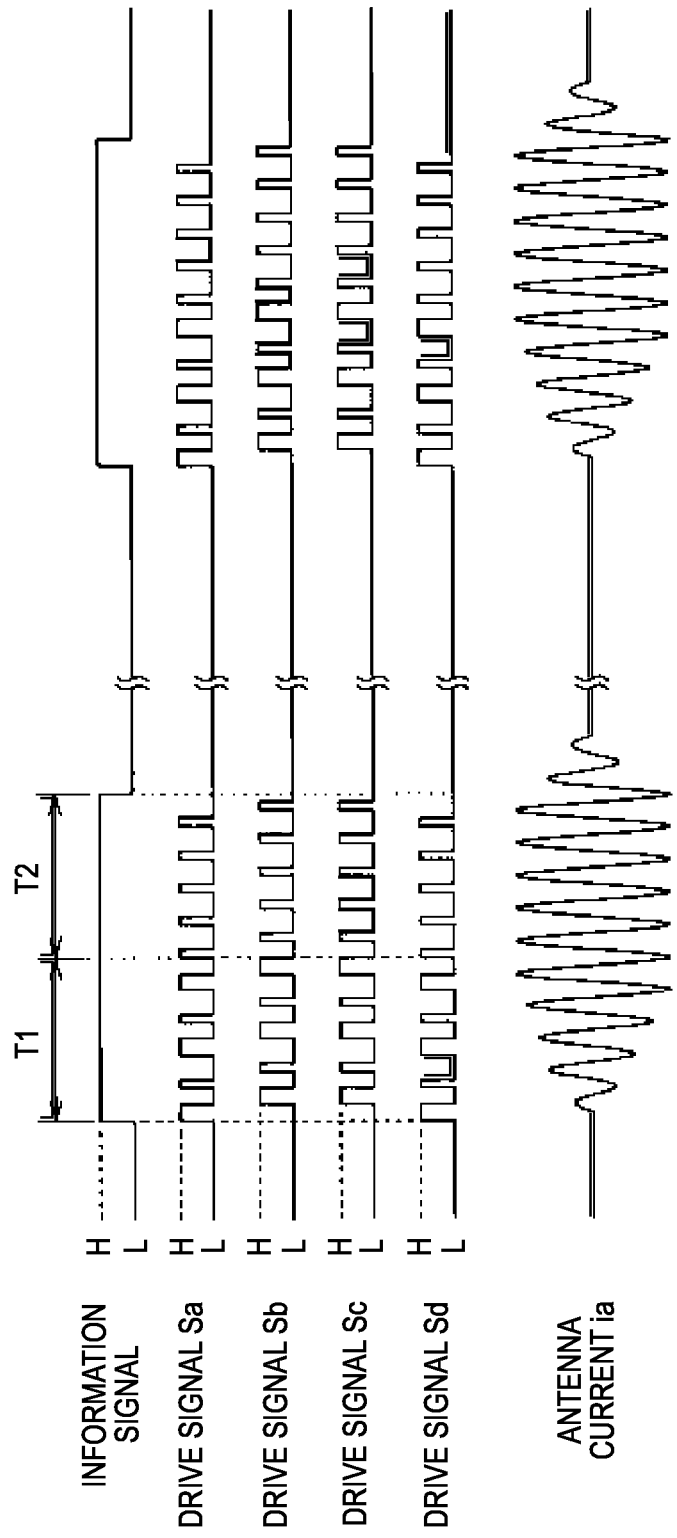
FIG. 11 is a time chart illustrating the drive control mode of a fifth embodiment disclosed here.

Referring now to FIG. 11, a fifth embodiment disclosed here will be described. The fifth embodiment has a configuration different from the fourth embodiment in that the duty ratios of the drive signals Sa to Sd are switched among a plurality of types of predetermined initial duty ratios during the rising period T1, and hence the detailed description of the same portion is omitted.

As illustrated in FIG. 11, 50% and 25% as two types of predetermined initial duty ratios are employed as the duty ratios of the drive signals Sa to Sd during the rising period T1. Then, the duty ratios of the drive signals Sa to Sd at this time is switched between 50% and 25% alternately. Therefore, the average value of the duty ratios of the drive signals Sa to Sd during the rising period T1 is an intermediate between 50% and 25%. Needless to say, the average value of the duty ratios of the drive signals Sa to Sd during the rising period T1 is closer to 50% than the duty ratio of the drive signals Sa to Sd during the subsequent stationary period T2 (25%).

As described above in detail, the following advantages are achieved according to the fifth embodiment in addition to the effects of (1) and (3) to (6) of the fourth embodiment.

(1) According to the fifth embodiment, during the rising period T1, the average value of the duty ratios during the corresponding period can be adjusted easily by switching the duty ratios of the drive signals Sa to Sd selectively between the plurality of types (50% and 25%), and hence the rising time of the antenna current can be adjusted further easily.

(2) According to the fifth embodiment, during the rising period T1, the control circuit 21 is capable of adjusting the average value of the duty ratios during the corresponding period only by switching the duty ratios of the drive signals Sa to Sd selectively between two types (50% and 25%) alternately, and hence the operation load of the control circuit 21 can be alleviated.

The fifth embodiment described above may be modified as follows.

Figure 7:
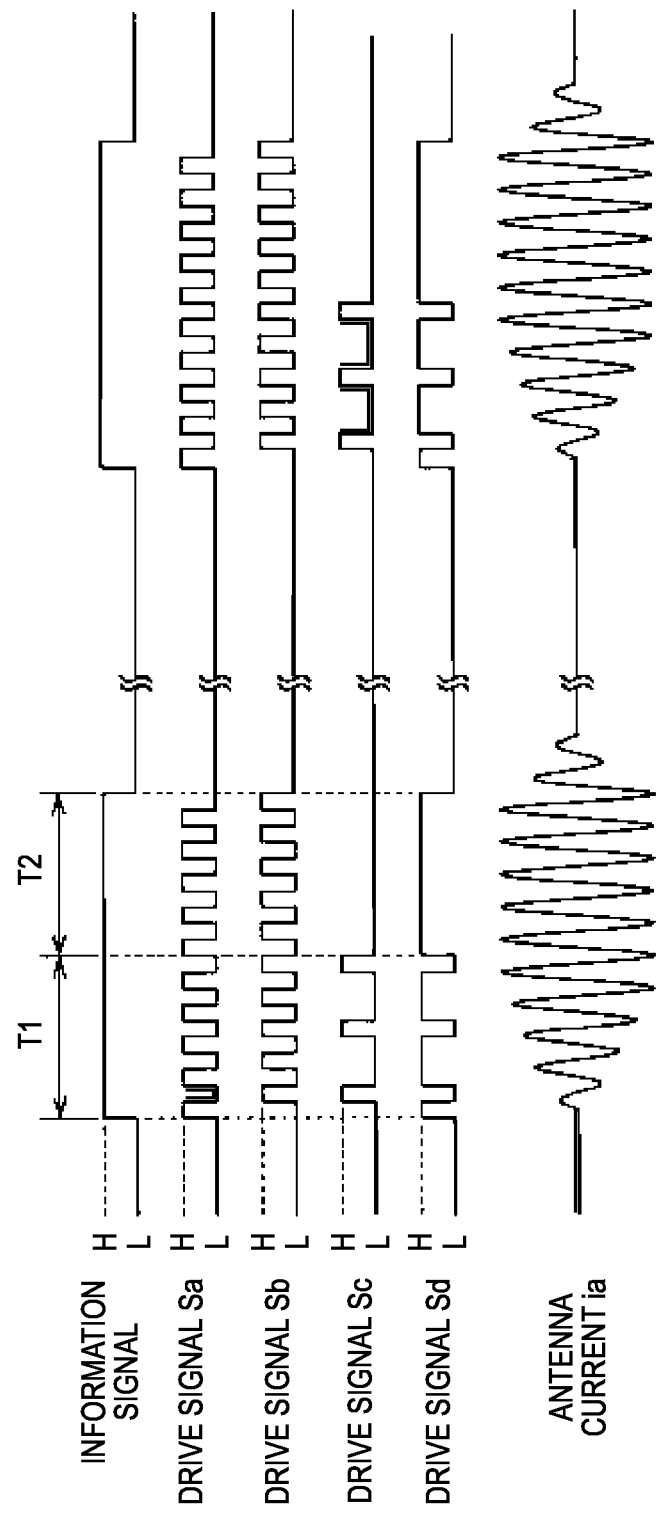
FIG. 7 is a time chart illustrating the driving control mode of a modification of the embodiment disclosed here.

As illustrated in FIG. 7, in the first embodiment, a configuration in which the drive signal sd is turned OFF at ½ a frequency at which the drive signal Sa is turned OFF during the rising period T1, and the drive signal Sc is turned ON at ½ a frequency at which the drive signal Sb is turned ON is also applicable. In other words, in the rising period T1, the full-bridge state and the half-bridge state may be switched alternately. In this configuration, in addition to the advantages of (1) and (3) to (6) of the first embodiment described above, the antenna current ia may be raised in the intermediate rising time between the rising time of the antenna current ia only in the full-bridge state and the rising time of the antenna current ia only in the half-bridge state.

In the first and second embodiments, the pulse voltage Vp is brought into the half-bridge state by applying the pulse voltage Vp to the antenna 10 as the antenna drive voltage Vd. In contrast, it is also possible to apply the reverse pulse voltage Vn as the antenna drive voltage Vd to the antenna 10 to achieve the half-bridge state. In the same manner, in the third embodiment, the pulse voltage Vp may be brought into the half-bridge state by applying the pulse voltage Vp to the antenna 10 as the antenna drive voltage Vd.

In the second embodiment, the sensed voltage Vs correlated with the antenna current ia is monitored by the current sensing circuit 61, and rising of the antenna current ia is sensed. In contrast, it is also possible to sense the rising of the antenna current ia at a time point when the antenna current ia (the effective value) exceeds a predetermined level by using an adequate sensor (current sensor) monitoring the antenna current ia.

In the above-described embodiment, the full-bridge state and the half-bridge state may be mixed in a given mode during the period of starting the drive of the antenna 10 (rising period) during the transmission period for transmitting the transmission signal (ON period of the information signal). In the same manner, the full-bridge state and the half-bridge state may be mixed in a given mode during the subsequent period (stationary period) within the transmission period. What is essential is that the frequency of the full-bridge state per unit time is larger in the initial period of driving of the antenna 10 than in the subsequent period within the transmission period.

However, the subsequent period (stationary period) within the transmission period determines the output strength of the transmission signal from the antenna 10 relating to the restriction by Radio Act, and hence including only the half-bridge state is further preferable for reducing the operation load or the like.

Figure 12:
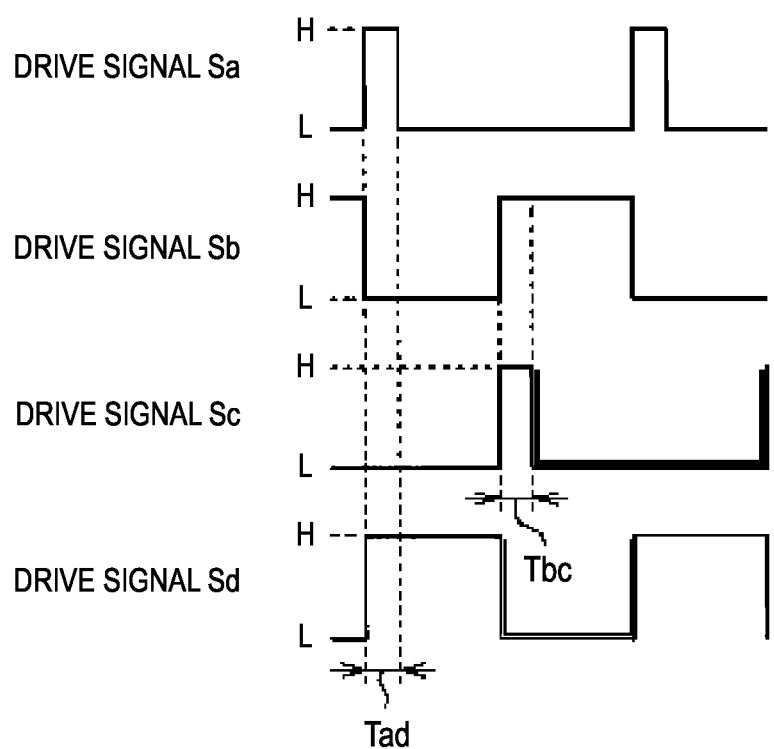
FIG. 12 is a time chart illustrating a modification of the embodiment disclosed here.

As illustrated in FIG. 12, the ON periods (pulse widths) of the drive signals Sa and Sd may be different from each other. In the same manner, the ON periods of the drive signals Sb and Sc may be different from each other. For example, the ON period of the drive signal Sa corresponds to the duty ratio 25%, and the ON period of the drive signal Sd corresponds to the duty ratio 50%. The ON period of the drive signal Sb corresponds to the duty ratio 50%, and the ON period of the drive signal Sc corresponds to the duty ratio 25%. In this case, the duty ratio corresponding to the ON period Tad in which the drive signals Sa and Sd are both turned ON is 25% and the duty ratio corresponding to the ON period Tbc in which the drive signals Sb and Sc are both turned ON is 25%.

Therefore, the duty ratios of the drive signals Sa to Sd relating to generation of the antenna drive voltage Vd become substantially 25%, which is equivalent to a case where the duty ratios of all the drive signals Sa to Sd are 25%. In other words, the "duty ratios of the drive signals" of the embodiments disclosed here is defined as substantial duty ratios of the drive signals Sa to Sd relating to the generation of the antenna drive voltage Vd correlated with the antenna current ia.

In the fifth embodiment described above, three or more types of the predetermined initial duty ratios (for example, 10%, 25%, and 50%) as duty ratios of the drive signals Sa to Sd during the rising period T1 may be employed. Also, the combination of the predetermined initial duty ratios during the rising period T1 is arbitrary. What is essential is that the average value of the duty ratios of the drive signals Sa to Sd in the rising period T1 is closer to 50% than the duty ratio of the drive signals Sa to Sd during the subsequent stationary period T2.

In the fourth and fifth embodiments, the duty ratios of the drive signals Sa to Sd are changed by the elapsed time from the start of the ON period of the information signal reaching the predetermined period. In contrast, the duty ratios may be changed by the numbers of pulses of the drive signals Sa to Sd from the start of the ON period of the information signal reaching the predetermined number of times.

In the fourth and fifth embodiments, the H-bridge circuit 22 may include four switching elements including pMOS transistors, four switching elements including a set of the nMOS transistor and the pMOS transistor, and four switching elements including bipolar transistor and the like.

In the fourth and fifth embodiments, a half-bridge circuit including two switching elements instead of the H-bridge circuit 22 (full-bridge circuit) may be employed.

In the embodiment disclosed herein, the antenna 10 may be installed in a vehicle door, in a door knob, in a pillar, in a side mirror, in a cabin or the like.

The embodiment disclosed here may be applied to a so-called tire pressure monitor system (TPMS) configured to sense the air pressure or the temperature of the tire by a wireless communication with a sensor provided in a tire or in the interior of a wheel of the vehicle.

Subsequently, the technical idea understood from the embodiment and other examples described above will be added below.

A first aspect of this disclosure is directed to an antenna drive apparatus configured to apply an antenna drive voltage to the antenna from an H-bridge circuit including four switching elements to drive the antenna, including: a switching mechanism configured to switch between a full-bridge state in which a differential voltage between a pulse voltage and a reverse pulse voltage reversed from the pulse voltage is applied to the antenna as the antenna drive voltage by the H-bridge circuit, and a half-bridge state in which the pulse voltage or the reverse pulse voltage is applied to the antenna as the antenna drive voltage by the H-bridge circuit; and a control mechanism configured to control the switching mechanism so that the frequency of the full-bridge state per unit time during an initial period of driving of the antenna in a transmission period for transmitting a transmission signal by the antenna becomes higher than that during the subsequent period subsequent to the initial period in the transmission period.

In this configuration, in the full-bridge state, the antenna drive voltage has double an amplitude of the pulse voltage (or a reverse pulse voltage), and hence the antenna current of the antenna to which the antenna drive voltage is to be applied is increased correspondingly. In contrast, in the half-bridge state, the antenna drive voltage has double an amplitude of the pulse voltage (or a reverse pulse voltage), and hence the antenna current of the antenna to which the antenna drive voltage is to be applied is reduced correspondingly.

In the initial period of driving of the antenna, the frequency of being in the full-bridge state per unit time is relatively large, and hence the rising time of the antenna current is shortened. In this case, time required for the transmission signal from the antenna generated by the antenna current to reach the predetermined output strength which can be recognized on the side of a receiver may be shortened, so that the transmission speed of the transmission signal is increased.

Also, in the subsequent period within the transmission period, since the frequency of being in the full-bridge state per unit time is relatively small, the increase of the antenna current is suppressed. In this case, the output strength of the transmission signal from the antenna by the antenna current may be suppressed from becoming excessively large.

A second aspect of this disclosure is directed to the antenna drive apparatus according to the first aspect, which further includes: a sensing mechanism configured to sense the antenna current of the antenna during the transmission period, and the control mechanism controls the switching mechanism so that the frequency of the full-bridge state per the unit time is relatively reduced in the subsequent period in the transmission period at a time point when the antenna current exceeds a predetermined level.

In this configuration, the control mechanism suppresses the increase of the antenna current at a time point when the antenna current exceeds the predetermined level, that is, at a time point when the rising of the antenna current is actually confirmed. Therefore, increase of the antenna current in the state of insufficient rising of the antenna current or excessive increase of the antenna current are suppressed.

A third aspect of this disclosure is directed to the antenna drive apparatus according to the first or second aspect, wherein the control mechanism controls the switching mechanism so as to combine the full-bridge state and the half-bridge state at the initial period of driving of the antenna and include only the half-bridge state during the subsequent period in the transmission period.

In this configuration, the antenna current may be raised in the intermediate rising time between the rising time of the antenna current only in the full-bridge state and the rising time of the antenna current only in the half-bridge state during the initial period of driving of the antenna.

A fourth aspect of this disclosure is directed to the antenna drive apparatus according to the first or second aspect, wherein the control mechanism controls the switching mechanism so as to include only the full-bridge state during the initial period of driving of the antenna and include only the half-bridge state during the subsequent period in the transmission period.

In this configuration, since the number of times of switching operations between the full-bridge state and the half-bridge state may be only once within the transmission period, the operation load of the control mechanism may be alleviated.

A fifth aspect of this disclosure is directed to an antenna drive apparatus configured to drive the antenna by controlling a duty ratio of a pulsed drive signal which applies the antenna drive voltage to the antenna, including: a control mechanism configured to control the duty ratio of the drive signal so that an average value of the duty ratio during a predetermined initial period of driving of the antenna in a transmission period for transmitting a transmission signal by the antenna is closer to 50% than a predetermined duty ratio set during the subsequent period subsequent to the predetermined initial period in the transmission period.

In general, the antenna current of the antenna to which the antenna drive voltage is applied is increased as the duty ratio of the drive signal is closer to 50%, and is reduced as it is farther from 50% (difference from the 50% is large). In this configuration, since the average value of the duty ratio of the predetermined initial period of driving of the antenna is close to 50%, the rising period of the antenna current is shortened. In this case, time required for the transmission signal from the antenna generated by the antenna current to reach the predetermined output strength which can be recognized on the side of a receiver may be shortened, so that the transmission speed of the transmission signal is increased.

Also, in the subsequent period within the transmission period, since the predetermined duty ratio is relatively far from 50%, the increase of the antenna current is suppressed. In this case, the output strength of the transmission signal from the antenna by the antenna current may be suppressed from becoming excessively large.

Furthermore, since the control mechanism is only required to monitor the elapsed time from the start of driving of the antenna and set the duty ratio of the drive signal to the predetermined duty ratio when reached to the predetermined period, the operation load of the control mechanism may be alleviated.

A sixth aspect of this disclosure is directed to the antenna drive apparatus according to the fifth aspect, wherein the control mechanism sets the duty ratio of the drive signal to the predetermined initial duty ratio closer to 50% than the predetermined duty ratio during the predetermined initial period of the driving of the antenna.

In this configuration, since the control mechanism is only required to switch the duty ratio of the drive signal either the predetermined initial duty ratio or the predetermined duty ratio during the predetermined initial period of driving of the antenna and the subsequent period within the transmission period, the operation load of the control mechanism is further reduced.

A seventh aspect of this disclosure is directed to the antenna drive apparatus according to the fifth aspect, wherein the control mechanism switches the duty ratio of the drive signal between a plurality of types of predetermined initial duty ratios during the predetermined initial period of driving of the antenna.

In this configuration, during the predetermined initial period of driving of the antenna, the average value of the duty ratio of the corresponding period may be adjusted further easily by selectively switching the duty ratio of the drive signal among the plurality of types of the predetermined initial duty ratios, and hence the rising period of the antenna current can be adjusted further easily.

An eighth aspect of this disclosure is directed to the antenna drive apparatus according to the seventh aspect, wherein the control mechanism switches the duty ratio of the drive signal between two types of predetermined initial duty ratios during the predetermined initial period of driving of the antenna alternately. In this configuration, during the predetermined initial period of driving of the antenna, the average value of the duty ratio during the corresponding period may be adjusted only by switching the duty ratio of the drive signal alternately between the two types of the predetermined initial duty ratios, and hence the operation load of the control mechanism may be reduced.

According to the aspects of this disclosure, there is provided the antenna drive apparatus capable of increasing the transmission speed of the transmission signal from the antenna while preventing an excessive increase of the output strength of the transmission signal from the antenna or while suppressing the increase of the operation load.

(i) The antenna drive apparatus according to any of the aspects described above may be configured such that the control mechanism controls the switching mechanism so that the frequency of the full-bridge state per the unit time is relatively reduced in the subsequent period within the transmitting period at a time point when the elapsed time from the start of the transmission period exceeds a predetermined period. In this configuration, the control mechanism suppresses the increase of the antenna current at the time point when the elapsed time from the start of the transmission period exceeds the predetermined period. Therefore, since the control mechanism basically needs only to monitor the elapsed time, the operation load of the control mechanism may be alleviated.

(ii) The antenna drive apparatus according to any of the aspects described above may be configured such that the control mechanism sets the duty ratio of the drive signal to 50% as the predetermined initial duty ratio during the predetermined initial period of driving of the antenna. In this configuration, during the predetermined period at the initial period of driving of the antenna, since all the duty ratios of the drive signals are 50%, the rising period of the antenna current is minimized.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An antenna drive apparatus configured to apply an antenna drive voltage to an antenna from an H-bridge circuit including four switching elements to drive the antenna, comprising:
    a switching mechanism configured to switch between a full-bridge state in which a differential voltage between a pulse voltage and a reverse pulse voltage reversed from the pulse voltage is applied to the antenna as the antenna drive voltage by the H-bridge circuit, and a half-bridge state in which the pulse voltage or the reverse pulse voltage is applied to the antenna as the antenna drive voltage by the H-bridge circuit; and
    a control mechanism configured to control the switching mechanism so that the frequency of the full-bridge state per unit time during an initial period of driving of the antenna in a transmission period for transmitting a transmission signal by the antenna becomes higher than that during the subsequent period subsequent to the initial period in the transmission period.

2. The antenna drive apparatus according to claim 1, further comprising:
    a sensing mechanism configured to sense an antenna current of the antenna during the transmission period, wherein
    the control mechanism controls the switching mechanism so that the frequency of the full-bridge state per the unit time is relatively reduced in the subsequent period in the transmitting period at a time point when the antenna current exceeds a predetermined level.

3. The antenna drive apparatus according to claim 1, wherein
the control mechanism controls the switching mechanism so as to combine the full-bridge state and the half-bridge state during the initial period of driving of the antenna and include only the half-bridge state during the subsequent period in the transmission period.

4. The antenna drive apparatus according to claim 1, wherein
the control mechanism controls the switching mechanism so as to include only the full-bridge state during the initial period of driving of the antenna and include only the half-bridge state during the subsequent period in the transmission period.

5. An antenna drive apparatus configured to drive an antenna by controlling a duty ratio of a pulsed drive signal which applies an antenna drive voltage to the antenna, comprising:
a control mechanism for controlling the duty ratio of the drive signal so that an average value of the duty ratio during a predetermined initial period of driving of the antenna in a transmission period for transmitting a transmission signal by the antenna is closer to 50% than a predetermined duty ratio set during the subsequent period subsequent to the predetermined initial period in the transmission period.

6. The antenna drive apparatus according to claim 5, wherein
the control mechanism sets the duty ratio of the drive signal to a predetermined initial duty ratio closer to 50% than the predetermined duty ratio during the predetermined initial period of the driving of the antenna.

7. The antenna drive apparatus according to claim 5, wherein
the control mechanism switches the duty ratio of the drive signal between a plurality of types of predetermined initial duty ratios during the predetermined initial period of driving of the antenna.

8. The antenna drive apparatus according to claim 7, wherein
the control mechanism switches the duty ratio of the drive signal between two types of predetermined initial duty ratios during the predetermined initial period of driving of the antenna alternately.

* * * * *